United States Patent [19]

Gross

[11] Patent Number: 4,935,704

[45] Date of Patent: Jun. 19, 1990

[54] LOW DISTORTION LINEAR AMPLIFIER WITH HIGH-LEVEL OUTPUT

[75] Inventor: William H. Gross, Sunnyvale, Calif.

[73] Assignee: Elantec, Milpitas, Calif.

[21] Appl. No.: 329,260

[22] Filed: Mar. 27, 1989

[51] Int. Cl.⁵ .............................................. H03F 3/26
[52] U.S. Cl. .................................... 330/263; 330/266; 330/267
[58] Field of Search ............... 330/263, 265, 266, 267, 330/268, 289, 310, 311

[56] References Cited

U.S. PATENT DOCUMENTS

| | | | |
|---|---|---|---|
| 4,502,020 | 2/1985 | Nelson et al. | 330/265 |
| 4,814,723 | 3/1989 | Botti | 330/263 |
| 4,827,223 | 5/1989 | Gross | 330/267 |

Primary Examiner—Steven Mottola
Attorney, Agent, or Firm—A. C. Smith

[57] ABSTRACT

An improved direct-coupled transistor amplifier circuit includes a pair of complementary conductivity type output transistors that are quiescently biased to slightly conductive state to provide low distortion amplification and temperature stabilized operating conditions. A pair of complementary conductivity type input transistors receive bias current having a value that is substantially matched to the change with temperature of base-emitter voltage of an input transistor divided by the value of a resistor connecting the emitter of the input transistor to receive the bias current.

4 Claims, 1 Drawing Sheet

LOW DISTORTION LINEAR AMPLIFIER WITH HIGH-LEVEL OUTPUT

RELATED APPLICATION

The subject matter of this application relates to the subject mater set forth in pending application for U.S. Pat. Ser. No. 329,263, entitled BRIDGE-TYPE LINEAR AMPLIFIER WITH WIDE DYNAMIC RANGE AND HIGH EFFICIENCY, filed Mar. 27, 1989, by William H. Gross, which subject matter is incorporated herein by this reference.

BACKGROUND OF THE INVENTION

Field of Invention

This invention relates to transistor amplifier circuits and more particularly to such amplifier circuits for providing high-level output with low signal distortion.

Certain known transistor amplifier circuits for operation at high levels of output signal commonly operate with complementary output transistors having collector electrodes connected to the common output node, and with the emitter electrodes connected to the bias supplies. These circuits commonly suffer from thermal run-away which results in excessively high quiescent current in the output transistors as operating temperature increases. One known scheme for correcting this problem includes using low base-emitter bias voltage to bias off the output transistors, even at high operating temperatures. However, such biasing condition of the output transistors contributes high levels of "deadband" distortion due to the gap in conductivities of the output transistors as they are alternately driven from off to conductive condition by the applied signals.

Alternatively, other known transistor circuits for operation at high levels of output signal include complementary output transistors having the emitter electrodes connected to the common output node, and having collector electrodes connected to the bias supplies. These known circuits introduce high-level distortion attributable to the output level only being able to swing within the limit of the base-emitter junction voltage (Vbe) difference between the bias supply and the reference or ground potential.

SUMMARY OF THE INVENTION

In accordance with the present invention, a pair of complementary output power transistors are connected in common-emitter configuration to provide maximum signal swing, and are biased slightly conductive to minimize conduction cross-over, or 'dead-band' distortion using thermally-stabilized biasing conditions that do not require adjustment.

DESCRIPTION OF THE PREFERRED EMBODIMENT

Figure 1:
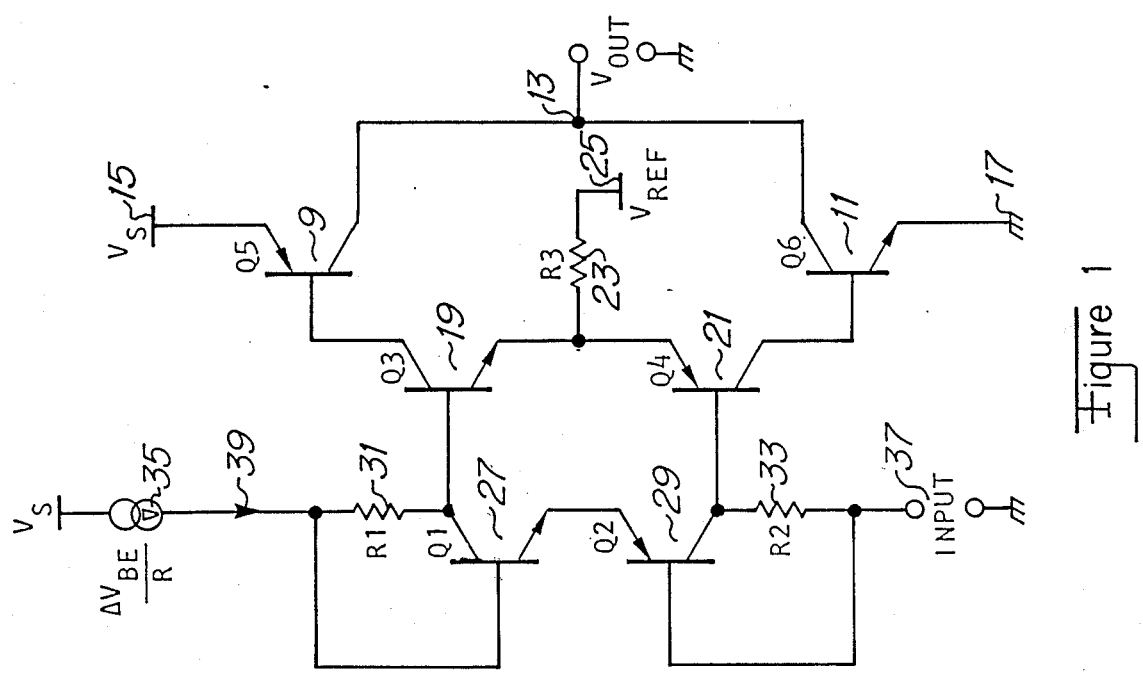
FIG. 1 is a schematic diagram of one embodiment of the invention.

Referring now to FIG. 1, there is shown a schematic diagram of one embodiment of the present invention in which a pair of complementary-conductivity type output transistors 9, 11 are connected with the collector electrodes connected to the output node 13 and with the emitter electrodes connected to the bias supplies (including ground or reference potential) 15, 17. The base electrodes of output transistors 9, 11 are connected to the collector electrodes of respective ones (of opposite complementary conductivity type) driver transistors 19, 21, the emitters of which are connected in common through resistor 23 to suitable bias supply 25. The base electrodes of the driver transistors 19, 21 are connected to respective ones of the collector electrodes (of similar complementary conductivity type) input transistors 27, 29, the emitters of which are connected only together. The collector electrode of transistor 27 is connected through resistor 31 to a current source 35, and the collector of transistor 29 is connected through resistor 33 to receive applied signal at the input terminals 37. The base electrodes of the input transistors are connected to receive the voltage drop across the respective resistors relative to the respective collector electrode.

In operation, the bias for each of the transistors 19, 21 is determined by the Vbe of the corresponding input transistors 27, 29, and by the current 39 from current source 35 times the value of the associated resistor 31, 33. This establishes small but well-controlled current in the collectors of the driver transistors 19, 21 which biases the output transistors 9, 11 in the active or conduction state. This bias condition is temperature stabilized by selecting the current 39 from current source 35 and the values of resistors 31, 33 to establish a voltage drop thereacross that is proportional to the change in the difference in Vbe of the input transistors and the driver transistors with temperature (approximately +3000 PPM/° C.).

Applied signal appearing on input terminals 37 (with respect to ground or reference potential) thus alters the bias network of input transistors 27, 29, resistors 31, 33 and current source 35 to alter the conductivity of driver transistors 19, 21 from more to less, and vice versa. Similarly, as driver transistor 19 conducts more, output transistor 9 conducts more while driver transistor 21 conducts less and output transistor 11 conducts less, and vice-versa on applied signal of alternating polarity on input terminals 37. However, because each of the output transistors 9, 11 are biased to conduction slightly as previously described, the output transistor that is being signal driven toward conduction begins conducting earlier than at zero signal condition, while the other output transistor is still conducting and is being signal driven toward cutoff. This overlapping conduction condition of the output transistors 9, 11 therefore eases the transition between conduction conditions thereto with concomitant lower levels of distortion commonly due to "dead band" conduction transition associated with signal conditions around zero value. The current that flows in the output transistors 9, 11 for zero applied signal level is thus set by well-controlled, temperature-stabilized bias currents attributable to the current through resistors 31, 33 to develop voltage drops matching the Vbe variations with temperature in transistors 27 and 29. The total variations with temperature over a typical range of operating temperatures may only be about 3 to 1 (from initial low values), and do not significantly alter or affect the fidelity of signal amplification from input 37 to output 13 over a wide dynamic range of applied signal levels.

Figure 2:
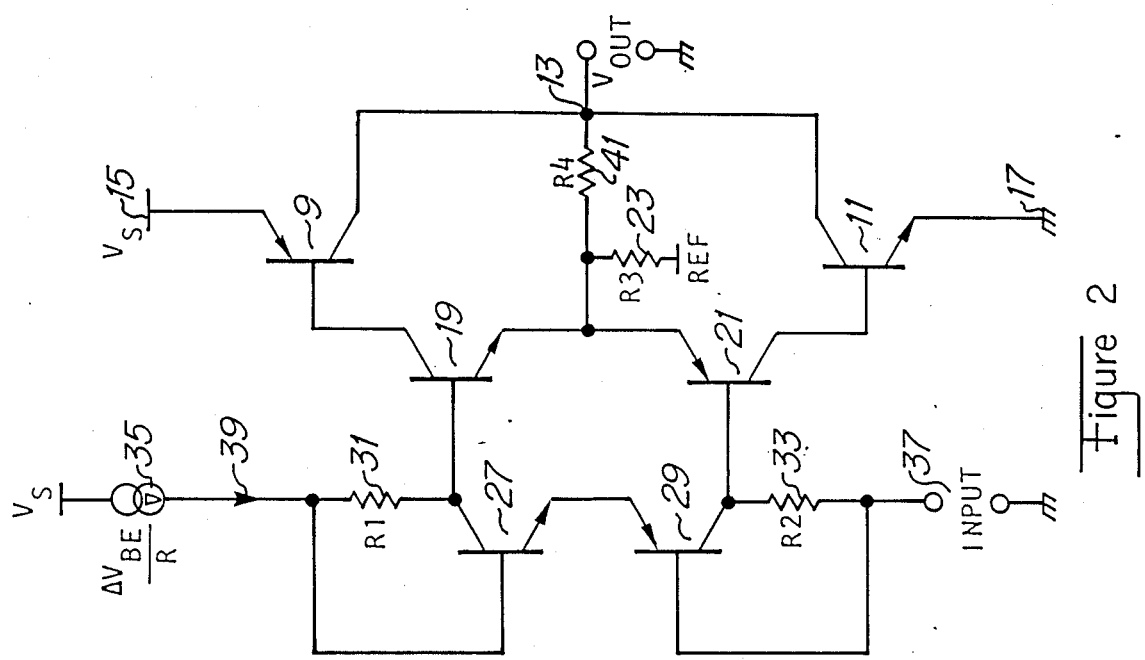
FIG. 2 is a schematic diagram of another embodiment of the invention.

Referring now to FIG. 2, there is shown another embodiment of the present invention in which local negative feedback from output node 13 may be applied to the emitter resistor 23 through resistor 41 to diminish any distortion attributable to the transition in conduction of the output transistors on applied alternating signal at input terminals 37 by a factor related to the loop gain around the local feedback. In addition, the local feedback network including resistors 23 and 41 increases the bandwidth, lowers the output impedance, stabilizes the gain, and improves linearity over the range of applied signal levels.

What is claimed is:

1. A circuit for amplifying a signal from an input node to an output node, the circuit comprising:
   a pair of complementary conductivity type output transistors having collector electrodes connected to form said output node, and having emitter electrodes and base electrodes;
   a pair of complementary conductivity type driver transistors having collector electrodes connected to respective base electrodes of opposite conductivity type output transistors and having emitter electrodes connected together and to a common node, and having base electrodes;
   source means of bias signals connected to the emitter electrodes of the output transistors and to the common node;
   a pair of complementary conductivity type input transistors having emitter electrodes connected together and having collector electrodes connected to the base electrodes of same conductivity type driver transistors, and having base electrodes;
   a pair of resistors each having a terminal connected to the collector electrode of one of the respective input transistors and having another terminal connected to the base electrode of the corresponding one of said pair of input transistors, the common connection of the base electrode of one of said pair of input transistors and another terminal of the corresponding resistor forming an input node; and
   current source means connected to supply current to the common connection of the base electrode of the other of said pair of input transistors and another terminal of the corresponding resistor.

2. A circuit according to claim 1 wherein the magnitude of the current supplied by said current source means is substantially equal to the value of the difference in the base-emitter voltages of the input transistors operating at different current levels divided by the value of one of said resistors.

3. A circuit according to claim 1 comprising:
   another resistor connecting said common node to receive a bias signal of said source means.

4. A circuit according to claim 3 comprising:
   a feedback resistor connected between said output node and the common connection of the emitter electrodes of the driver transistors and said other resistor.

* * * * *